(12) United States Patent
Huang et al.

(10) Patent No.: US 9,307,671 B2
(45) Date of Patent: Apr. 5, 2016

(54) BOARD COOLING APPARATUS AND INFORMATION EQUIPMENT

(71) Applicant: Huawei Technologies Co., Ltd., Shenzhen (CN)

(72) Inventors: Shuliang Huang, Shenzhen (CN); Zhaoxia Luo, Shenzhen (CN); Youhe Ke, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 341 days.

(21) Appl. No.: 13/964,948

(22) Filed: Aug. 12, 2013

(65) Prior Publication Data
US 2013/0329362 A1    Dec. 12, 2013

Related U.S. Application Data

(63) Continuation of application No. PCT/CN2012/083666, filed on Oct. 29, 2012.

(30) Foreign Application Priority Data

Mar. 29, 2012    (CN) .......................... 2012 1 0087701

(51) Int. Cl.
*H05K 7/20*    (2006.01)
*G06F 1/20*    (2006.01)

(52) U.S. Cl.
CPC .............. *H05K 7/20* (2013.01); *H05K 7/20727* (2013.01)

(58) Field of Classification Search
CPC . H05K 7/20; H05K 7/20309; H05K 7/20936; H01L 23/34; H01L 23/473; H01L 23/4735; F28D 15/00; F28F 3/08; G06F 1/20; G06F 1/206; B23P 19/00

USPC .............. 361/679.46–679.53, 688, 689, 698, 361/699, 700–715, 719–722; 165/80.2, 165/80.4, 80.5, 104.19, 104.33, 104.34, 165/185; 174/15.1, 15.2, 16.3, 252; 257/706–727; 62/259.2
See application file for complete search history.

(56) References Cited

U.S. PATENT DOCUMENTS 3,524,497 A * 8/1970 Chu ...................... H01L 23/473
                                                                165/104.33
5,103,374 A * 4/1992 Azar .................. H05K 7/20563
                                                                165/80.3

(Continued)

FOREIGN PATENT DOCUMENTS

| CN | 101490841 A | 7/2009 |
|---|---|---|
| CN | 102638957 A | 8/2012 |
| JP | 0494194 A | 3/1992 |

*Primary Examiner* — Michail V Datskovskiy
(74) *Attorney, Agent, or Firm* — Conley Rose, P.C.; Grant Rodolph; Nicholas K. Beaulieu

(57) ABSTRACT

Embodiments of the present invention relate to a board cooling apparatus comprising a shell and a board, where the board and an interior wall of the shell form a closed space, a cooling medium inlet and a cooling medium outlet are disposed on the shell, a separator plate that separates the board into a first part and a second part, a through opening between the first part and the second part, a cooling medium flows into the first part from the cooling medium inlet and then flows into the second part, and flows out from the cooling medium outlet, a flow guiding mechanism that is disposed on the board and configured to divert the cooling medium flowing into the first part from the cooling medium inlet, so as to directly guide part of the cooling medium into the second part.

11 Claims, 2 Drawing Sheets

(56) References Cited

U.S. PATENT DOCUMENTS

| | | | | |
|---|---|---|---|---|
| 5,205,348 A | * | 4/1993 | Tousignant | F28F 3/12 165/170 |
| 5,270,572 A | * | 12/1993 | Nakajima | H01L 23/4735 165/104.33 |
| 6,051,284 A | * | 4/2000 | Byrne | C23C 16/5096 118/671 |
| 7,285,851 B1 | * | 10/2007 | Cepeda-Rizo | G06F 1/20 257/712 |
| 2009/0205802 A1 | | 8/2009 | Yoshida et al. | |
| 2012/0138264 A1 | * | 6/2012 | Lee | H05K 7/20254 165/80.2 |

* cited by examiner

US 9,307,671 B2

BOARD COOLING APPARATUS AND INFORMATION EQUIPMENT

CROSS-REFERENCE TO RELATED APPLICATIONS

This application is a continuation of International Application No. PCT/CN2012/083666, filed on Oct. 29, 2012, which claims priority to Chinese Patent Application No. 201210087701.4, filed on Mar. 29, 2012, both of which are hereby incorporated by reference in their entireties.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

Embodiments of the present invention relate to the field of information technologies, and in particular to a board cooling apparatus and an information equipment.

BACKGROUND

Currently, air cooling is mainly adopted in an information and communication technology (ICT) equipment for heat dissipation. With the increasing of thermal density of the ICT equipment, a water cooling technology begins to be applied.

In the prior art, a separator plate is adopted to separate devices on a board inside a closed shell into two parts. A coolant enters the shell from one side of the separator plate, flows into the other side of the separator plate after cooling a device on the board at this side of the separator plate, and cools a device on the board at the other side of the separator plate. However, when the coolant enters the other side of the separator plate, the temperature of the coolant has increased. Therefore, heat dissipation for the device on the board at the other side of the separator plate is affected.

SUMMARY

Embodiments of the present invention provide a board cooling apparatus and an information equipment, which improve a heat dissipation effect for devices on a board.

In one aspect, an embodiment of the present invention provides a board cooling apparatus, including a shell and a board, where the board and an interior wall of the shell form a closed space, a cooling medium inlet and a cooling medium outlet are disposed on the shell, a cooling medium flows through the cooling medium inlet and into the closed space formed by the board and the interior wall of the shell and flows out through the cooling medium outlet after flowing through devices on the board, and multiple devices are disposed on the board; a separator plate is disposed on the board in a direction perpendicular to the board, the separator plate separates the board into a first part and a second part, and there is a through opening between the first part and the second part; the cooling medium flows into the first part from the cooling medium inlet, flows into the second part through the through opening after flowing through a device of the first part, and flows out from the cooling medium outlet after flowing through a device of the second part; and a flow guiding mechanism is further disposed on the board, and the flow guiding mechanism is configured to divert the cooling medium flowing into the first part from the cooling medium inlet, so as to guide part of the cooling medium into the second part directly.

In another aspect, an embodiment of the present invention further provides an information equipment, including at least one of the foregoing board cooling apparatus.

According to the board cooling apparatus and the information equipment provided in the embodiments of the present invention, a flow guiding mechanism is disposed on a board to directly guide part of a cooling medium, which enters, from a cooling medium inlet, a first part formed through separating by a separator plate, into a second part formed through separating by the separator plate. Temperature of the cooling medium directly guided into the second part does not increase, thereby facilitating heat dissipation for devices on the board.

BRIEF DESCRIPTION OF THE DRAWINGS

To describe the technical solutions in the embodiments of the present invention more clearly, the following briefly introduces accompanying drawings required for describing the embodiments. Apparently, the accompanying drawings in the following description are merely some embodiments of the present invention, and persons of ordinary skill in the art may further obtain other drawings according to these accompanying drawings without creative efforts.

DETAILED DESCRIPTION

Figure 1:
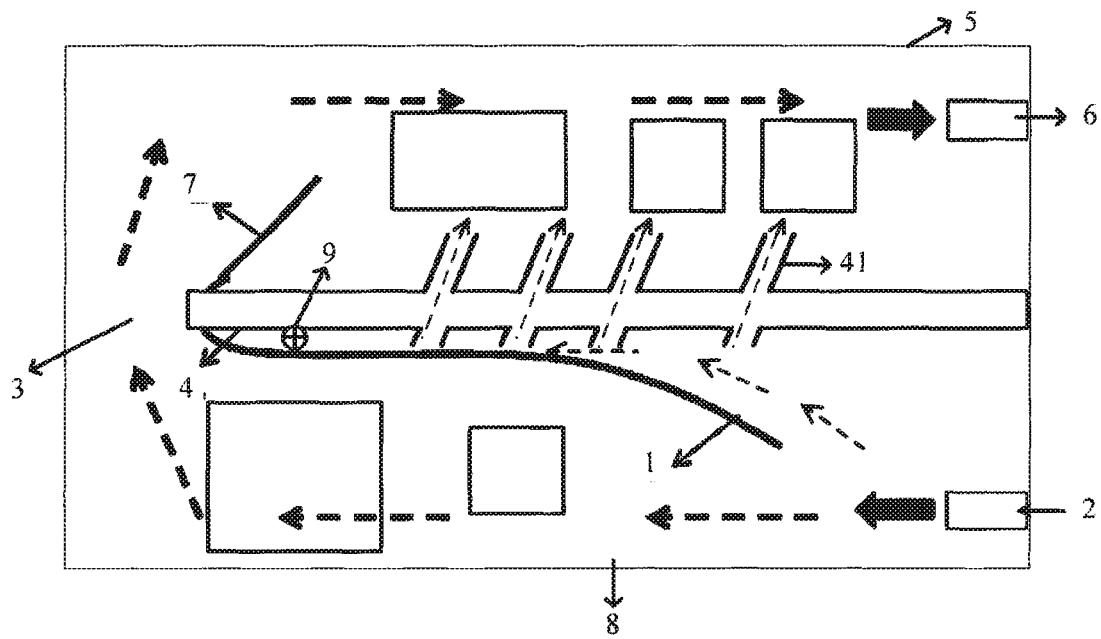
FIG. 1 is a schematic structural diagram of an embodiment of a board cooling apparatus according to the present invention.

To make the objectives, technical solutions, and advantages of the embodiments of the present invention more comprehensible, the following clearly describes the technical solutions in the embodiments of the present invention with reference to the accompanying drawings in the embodiments of the present invention. Apparently, the embodiments to be described are merely part rather than all of the embodiments of the present invention. All other embodiments obtained by persons of ordinary skill in the art based on the embodiments of the present invention without creative efforts shall fall within the protection scope of the present invention.

In an embodiment of a board cooling apparatus provided in the present invention, the apparatus includes a shell and a board, where the board and an interior wall of the shell form a closed space, a cooling medium inlet and a cooling medium outlet are disposed on the shell, a cooling medium flows, through the cooling medium inlet, into the closed space formed by the board and the interior wall of the shell and flows out through the cooling medium outlet after flowing through devices on the board, and multiple devices are disposed on the board; a separator plate is disposed on the board in a direction perpendicular to the board, the separator plate separates the board into a first part and a second part, and there is a through opening between the first part and the second part; the cooling medium flows into the first part from the cooling medium inlet, flows into the second part through the through opening after flowing through a device of the first part, and flows out from the cooling medium outlet after flowing through a device of the second part; and a flow guiding mechanism is further disposed on the board, and the flow guiding mechanism is configured to divert the cooling medium flowing into the first part from the cooling medium inlet, so as to guide part of the cooling medium into the second part directly.

The board is generally a printed circuit board (PCB), and multiple devices are disposed on the board, for example devices such as various integrated circuit (IC) chips, heat sinks, and connectors (e.g., devices 31 in FIGS. 1-4). The separator plate may have a plane structure, and may also have a curved surface structure. The separator plate is disposed on the board and a disposing direction is perpendicular (also including approximately perpendicular) to the board, and separates the board into the first part and the second part. The device included in the first part and the device included in the second part are separately located on both sides of the separator plate.

Alternatively, an edge of the board (such as four edges of a square board) may connect to the interior wall of the shell, so that the interior wall of the shell and the board form a closed space. Alternatively, surfaces of various devices disposed on the board may connect to an edge of the shell, so that the interior wall of the shell and the board form a closed space. If the board is generally placed vertically in actual use, the top of the separator plate disposed on the board may connect to the shell to completely separate both sides of the separator plate along an extension direction of the separator plate. If the board is generally placed horizontally in actual use, the top of the separator plate disposed on the board may connect to the shell, and may also not connect to the shell.

The cooling medium may specifically be cooling air, and may also be cooling liquid. The cooling medium inlet may be disposed at a position which is on the shell and is near the first part to allow the cooling medium to enter the first part through the cooling medium inlet, so as to cool down the device of the first part.

As one feasible implementation manner, the end which is of the separator plate and is near the cooling medium inlet may connect to the interior wall of the shell, a gap may exist between the end which is of the separator plate and is away from the cooling medium inlet and the interior wall of the shell. The gap is used as a through opening between the first part and the second part. The cooling medium flows into the first part from the cooling medium inlet. After flowing through the device of the first part, the cooling medium flows into the second part from the through opening to cool down the device of the second part. As another feasible implementation manner, both two ends which are of the separator plate and are parallel to the board connect to the interior wall of the shell, and a through opening between the first part and the second part may be disposed on the separator plate and may be located at the end which is of the separator plate and is away from the cooling medium inlet. Similarly, the cooling medium flows into the first part from the cooling medium inlet. After flowing through the device of the first part, the cooling medium flows into the second part through the through opening disposed on the separator plate to cool down the device of the second part.

The cooling medium outlet may be disposed at a position which is on the shell and is near the second part. The cooling medium enters the second part from the through opening and flows out of the shell from the cooling medium outlet after flowing through the device of the second part.

Because the cooling medium that flows into the second part from the through opening has flowed through the first part of the board, temperature of the cooling medium has increased and an effect of cooling down the device of the second part is affected. In this embodiment of the present invention, a flow guiding mechanism may be disposed on the board, and the flow guiding mechanism is configured to directly guide part of the cooling medium that flows into the first part from the cooling medium inlet to the second part.

As one feasible implementation manner, the flow guiding mechanism may be disposed perpendicularly (including approximately perpendicularly) to the board, and diverts, in a direction parallel to the board, the cooling medium flowing inward from the cooling medium inlet, so as to directly guide part of the cooling medium into the second part.

It should be understood that the flow guiding mechanism may be further disposed at a certain angle with the board in the perpendicular direction, and may still divert, in the direction parallel to the board, the cooling medium flowing inward from the cooling medium inlet, so as to directly guide part of the cooling medium into the second part.

The present invention provides an embodiment in which a flow guiding mechanism diverts, in a direction parallel to a board, a cooling medium flowing inward from a cooling medium inlet. As shown in FIG. 1, a flow guiding mechanism 1 may be disposed as a plate structure, and may also be disposed as a curved surface structure. One end of the flow guiding mechanism 1 may be disposed at a position near a cooling medium inlet 2, the other end of the flow guiding mechanism 1 may be disposed at a position near a through opening 3 and connect to a separator plate 4, and one or more spouts 41 may be disposed on the separator plate 4. After a cooling medium enters an inner cavity of a shell 5 from the cooling medium inlet 2, the cooling medium is diverted into two parts as the flow guiding mechanism 1 functions. Part of the cooling medium enters space between the flow guiding mechanism 1 and the separator plate 4 and may directly enter a second part through a spout 41 on the separator plate 4. After flowing through a device of a first part, the other part of the cooling medium enters the second part from the through opening 3. It can be seen that, as the flow guiding mechanism 1 functions, part of the cooling medium first cools down the device of the first part and then enters the second part from the through opening 3 to cool down a device of the second part, and the other part of the cooling medium enters space between the flow guiding mechanism 1 and the separator plate 4 and directly enters the second part through the spout 41 on the separator plate 4 to cool down the device of the second part directly, thereby facilitating heat dissipation for the device of the second part of the board.

After cooling down the device of the second part, the cooling medium entering the second part from the through opening 3 and the cooling medium directly entering the second part through the spout 41 on the separator plate 4 flows out of the shell 5 from a cooling medium outlet 6.

Alternatively, a flow-blocking plate 7 may be disposed on the end which is of the flow guiding mechanism 1 and is near the through opening 3. The flow-blocking plate 7 may have a plate structure, and may also have a curved surface structure. The flow-blocking plate 7 may prevent the cooling medium, which flows into the second part from the through opening 3 after flowing through the device of the first part, from flowing together with the cooling medium guided into the second part through the spout 41 on the separator plate 4. This prevents the temperature of the cooling medium guided into the second part through the spout 41 on the separator plate 4 from increasing under the influence of the cooling medium flowing into the second part from the through opening 3 and an effect of cooling down the device of the second part.

Alternatively, to cooperate with the flow guiding mechanism and effectively divert the cooling medium entering from the cooling medium inlet 2, a circulating pump 9 may be further disposed at a position which is on a board 8, near the through opening 3 and between the flow guiding mechanism 1 and the separator plate 4, so as to accelerate the guiding of part of the cooling medium into space between the separator plate 4 and the flow guiding mechanism 1.

Figure 2:
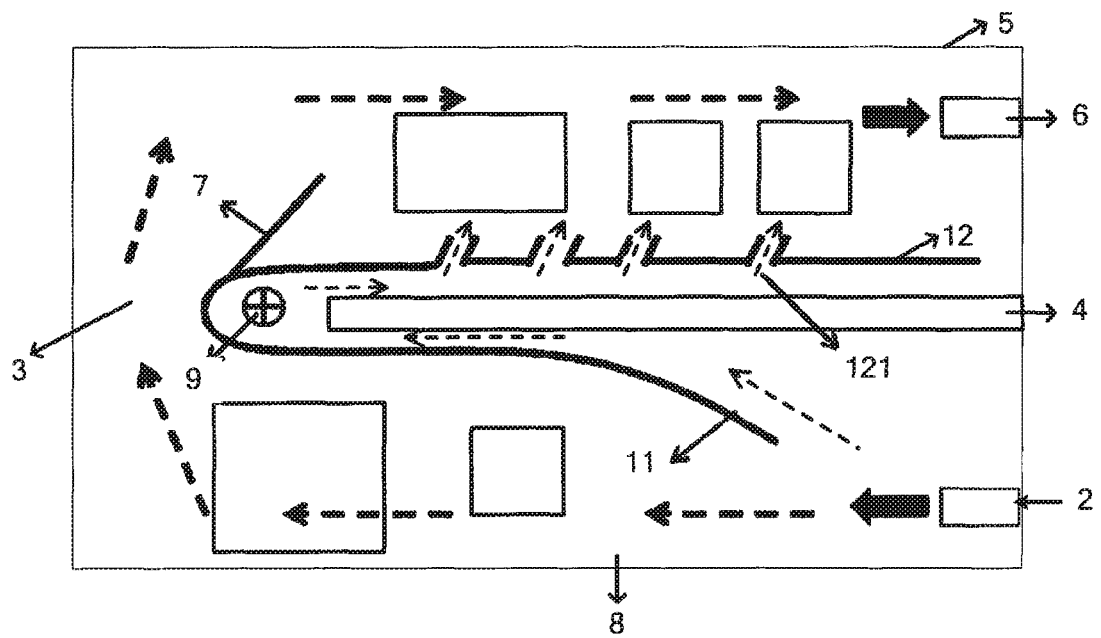
FIG. 2 is a schematic structural diagram of another embodiment of a board cooling apparatus according to the present invention.

The present invention further provides another embodiment in which a flow guiding mechanism diverts, in a direction parallel to a board, a cooling medium flowing inward from a cooling medium inlet. As shown in FIG. 2, a flow guiding mechanism may include a flow leading part 11 and a flow guiding part 12, where the flow leading part 11 and the flow guiding part 12 may be disposed around a separator plate 4, and at least one opening 121 may be disposed on the flow guiding part 12.

The flow leading part 11 may be disposed on the side which is of the separator plate and is near a first part. As the flow leading part 11 functions, part of a cooling medium flowing into the first part from a cooling medium inlet 2 is guided into space between the separator plate 4 and the flow guiding part 12, so as to guide part of the cooling medium into a second part through the opening 121.

The flow guiding part 12 may be disposed on the side which is of the separator plate and is near the second part and is configured to guide part of the cooling medium between the separator plate 4 and the flow guiding part 12 into the second part through the opening 121.

The flow leading part 11 and the flow guiding part 12 may have plane structures, and may also have curved surface structures. It can be seen that after the cooling medium enters an inner cavity of a shell 5 from the cooling medium inlet 2, the cooling medium is diverted into two parts as the flow leading part 11 functions. Part of the cooling medium enters space between the flow leading part 11 and the separator plate 4, further enters space between the flow guiding part 12 and the separator plate 4, and directly enters the second part from the opening 121 on the flow guiding part 12. This part of the cooling medium flows through space between the flow guiding mechanism 1 and the separator plate 4 and directly enters the second part through the opening 121 to cool down a device of the second part directly, thereby facilitating heat dissipation for the device of the second part of the board. After flowing through a device of the first part, the other part of the cooling medium enters the second part from a through opening 3. This part of the cooling medium first cools down the device of the first part, and then enters the second part from the through opening 3 to cool down the device of the second part.

Alternatively, a flow-blocking plate 7 may also be disposed on the end which is of the flow guiding part 12 and is near the through opening 3. The flow-blocking plate 7 may prevent the cooling medium, which flows into the second part from the through opening 3 after flowing through the device of the first part, from flowing together with the cooling medium guided into the second part through the opening 121. This prevents the temperature of the cooling medium guided into the second part through the opening 121 to increase under the influence of the cooling medium flowing into the second part from the through opening 3 and an effect of cooling down the device of the second part.

Alternatively, to cooperate with the flow guiding mechanism 1 and effectively divert the cooling medium entering from the cooling medium inlet 2, a circulating pump 9 may be further disposed at a position which is on a board 8, near the through opening 3 and between the flow guiding mechanism 1 and the separator plate 4, so as to accelerate the guiding of part of the cooling medium into space between the separator plate 4 and the flow guiding part 12.

Temperature of the cooling medium at the cooling medium inlet 2 is generally lower than that of the cooling medium at other positions of the board. Therefore, alternatively, a high power consumption device included in the first part and the second part may be disposed at a position which is on the board 8 and is near the cooling medium inlet 2 (it should be understood that the high power consumption device is disposed in the upstream of the cooling medium as much as possible), thereby facilitating cooling down of the high power consumption device.

Accordingly, a low power consumption device included in the first part and the second part may be disposed at a position which is on the board 8 and is near a cooling medium outlet 6 (it may be disposed in the downstream of the cooling medium as much as possible).

According to the board cooling apparatus provided in this embodiment, a flow guiding mechanism is disposed on a board to directly guide part of a cooling medium, which enters, from a cooling medium inlet, a first part formed through separating by a separator plate, into a second part formed through separating by the separator plate. Alternatively, the flow guiding mechanism may divert, in a direction parallel to the board, the cooling medium flowing inward from the cooling medium inlet, so as to directly guide part of the cooling medium entering an inner cavity of a shell into the second part, and temperature of the cooling medium directly guided into the second part does not increase, thereby facilitating heat dissipation for a device of the second part.

As another feasible implementation manner, the flow guiding mechanism may be disposed parallel (including approximately parallel) to the board, and diverts, in a direction perpendicular to the board, the cooling medium flowing inward from the cooling medium inlet, so as to directly guide part of the cooling medium into the second part.

It should be understood that the flow guiding mechanism may be further disposed at a certain angle with the board in the parallel direction, and may still divert, in the direction perpendicular to the board, the cooling medium flowing inward from the cooling medium inlet, so as to directly guide part of the cooling medium into the second part.

Figure 3:
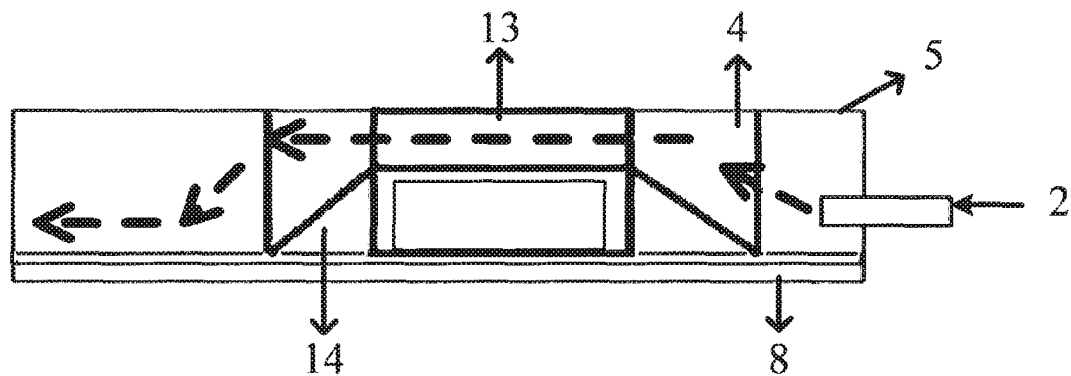
FIG. 3 is a side view of another embodiment of a board cooling apparatus according to the present invention.
Figure 4:
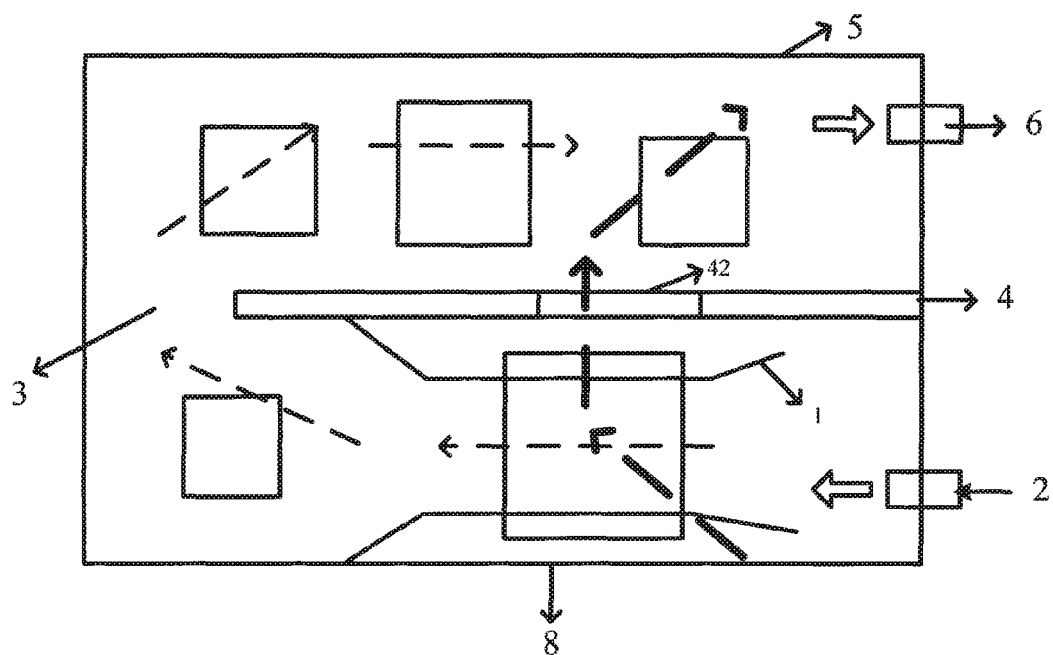
FIG. 4 is a top view of another embodiment of a board cooling apparatus according to the present invention.

The present invention provides an embodiment in which a flow guiding mechanism diverts, in a direction perpendicular to a board, a cooling medium flowing inward from a cooling medium inlet. FIG. 3 is a side view of a board cooling apparatus in this embodiment scenario, and FIG. 4 is a top view of the board cooling apparatus in this embodiment scenario. A flow guiding mechanism is separated into an upper part 13 and a lower part 14 in a direction parallel to a board 8, the upper part 13 connects to a shell 5, the lower part 14 connects to a separator plate 4, and a hole 42 is disposed on the separator plate 4.

The upper part 13 may guide, through space between the upper part 13 and the top of the shell 5, part of the cooling medium flowing into an inner cavity of the shell 5 from a cooling medium inlet 2 into a first part. The lower part 14 may guide part of the cooling medium flowing into the inner cavity of the shell 5 from the cooling medium inlet 2 into the hole 42 through space between the lower part 14 and the bottom of the shell 5 and then into a second part through the hole 42. It can be seen that after the cooling medium enters the inner cavity of the shell 5 from the cooling medium inlet 2, the cooling medium is diverted into two parts in the direction parallel to the board 8 as the flow guiding mechanism 1 functions. Part of the cooling medium is guided into the first part through space between the upper part 13 and the top of the shell 5, and enters the second part from a through opening 3 after flowing through a device of the first part. After first cooling down the device of the first part, this part of the cooling medium enters the second part from the through opening 3 to cool down a device of the second part. The other part of the cooling medium enters the hole 42 through space between the lower part 14 and the bottom of the shell 5, and enters the second part through the hole 42. This part of the cooling medium enters the second part through the hole 42 and directly cools down the device of the second part, thereby facilitating heat dissipation for the device of the second part of the board.

Alternatively, a high power consumption device included in the first part and the second part may be disposed at a position which is on the board 8 and corresponds to the lower part 14 of the flow guiding mechanism 1; alternatively, a high power consumption device included in the first part and the second part may be further disposed at a position which is on the board 8 and is near the cooling medium inlet 2, thereby facilitating cooling down of the high power consumption device.

Accordingly, a low power consumption device included in the first part and the second part may be disposed at a position which is on the board 8 and is near a cooling medium outlet 6.

According to the board cooling apparatus provided in this embodiment, a flow guiding mechanism is disposed on a board to directly guide part of a cooling medium, which enters, from a cooling medium inlet, a first part formed through separating by a separator plate, into a second part formed through separating by the separator plate. Alternatively, the flow guiding mechanism may divert, in a direction perpendicular to the board, the cooling medium flowing inward from the cooling medium inlet, so as to directly guide part of the cooling medium entering an inner cavity of a shell into the second part, and temperature of the cooling medium directly guided into the second part does not increase, thereby facilitating heat dissipation for a device of the second part.

An embodiment of the present invention further provides an information equipment, including at least one board cooling apparatus, where the information equipment provided in the present invention may be various types of equipment in the information and communication field, such as various servers.

The board cooling apparatus includes a shell and a board, where the board and an interior wall of the shell form a closed space, and a cooling medium inlet and a cooling medium outlet are disposed on the shell, and multiple devices are disposed on the board;

a separator plate is disposed on the board in a direction perpendicular to the board, the separator plate separates the board into a first part and a second part, and there is a through opening between the first part and the second part; a cooling medium flows into the first part from the cooling medium inlet, flows into the second part through the through opening after flowing through a device of the first part, and flows out from the cooling medium outlet after flowing through a device of the second part; and a flow guiding mechanism is further disposed on the board, and the flow guiding mechanism is configured to divert the cooling medium flowing into the first part from the cooling medium inlet, so as to guide part of the cooling medium into the second part directly.

In addition, for a specific structure and functions of a board cooling apparatus, reference may be made to an embodiment of a board cooling apparatus provided in the present invention, and details are not repeatedly described here.

According to the information equipment provided in this embodiment, a flow guiding mechanism is disposed on a board to directly guide part of a cooling medium, which enters, from a cooling medium inlet, a first part formed through separating by a separator plate, into a second part formed through separating by the separator plate. Temperature of the cooling medium directly guided into the second part does not increase, thereby facilitating heat dissipation for a device of the second part.

Finally, it should be noted that the foregoing embodiments are merely intended for describing the technical solutions of the present invention rather than limiting the present invention. Although the present invention is described in detail with reference to the foregoing embodiments, persons of ordinary skill in the art should understand that they may still make modifications to the technical solutions described in the foregoing embodiments, or make equivalent replacements to part of the technical features of the technical solutions described in the foregoing embodiments; however, these modifications or replacements do not make the essence of the corresponding technical solutions depart from the spirit and scope of the technical solutions in the embodiments of the present invention.

What is claimed is:
1. A board cooling apparatus, comprising:
a shell;
a board, wherein the board and an interior wall of the shell form a closed space, wherein a cooling medium inlet and a cooling medium outlet are disposed on the shell, wherein a cooling medium flows through the cooling medium inlet and into the closed space formed by the board and the interior wall of the shell, wherein the cooling medium flows out through the cooling medium outlet after flowing over electronic devices on the board, and wherein the electronic devices on the board comprise multiple devices that are disposed on the board;
a separator plate, wherein the separator plate is disposed on the board in a direction perpendicular to the board, wherein the separator plate separates the board into a first part and a second part, wherein a through opening is located between the first part and the second part, wherein the cooling medium flows into the first part from the cooling medium inlet and flows into the second part through the through opening after flowing through a device of the first part, and wherein the cooling medium flows out from the cooling medium outlet after flowing through a device of the second part; and
a flow guiding mechanism that is disposed on the board, wherein the flow guiding mechanism is configured to divert the cooling medium flowing into the first part from the cooling medium inlet, so as to guide part of the cooling medium into the second part directly.

2. The board cooling apparatus according to claim 1, wherein the end which is of the separator plate and is near the cooling medium inlet connects to the interior wall of the shell, a gap exists between the end which is of the separator plate and is away from the cooling medium inlet and the interior wall of the shell, and wherein the gap is the through opening.

3. The board cooling apparatus according to claim 1, wherein the end which is of the separator plate and is near the cooling medium inlet connects to the interior wall of the shell, wherein the end which is of the separator plate and is away from the cooling medium inlet connects to the interior wall of the shell, and wherein the through opening is disposed on the separator plate and located on the end which is of the separator plate and away from the cooling medium inlet.

4. The board cooling apparatus according to claim 1, wherein the flow guiding mechanism is disposed perpendicular to the board, and wherein the flow guiding mechanism is configured to divert, in a direction parallel to the board, the cooling medium flowing inward from the cooling medium inlet, so as to directly guide part of the cooling medium into the second part.

5. The board cooling apparatus according to claim 4, wherein a flow-blocking plate is disposed on the end which is of the flow guiding mechanism and is near the through opening, and wherein the flow-blocking plate is configured to prevent the cooling medium, which flows into the second part from the through opening after flowing through the device of the first part, from flowing together with the cooling medium guided into the second part through an opening.

6. The board cooling apparatus according to claim 4, wherein one end of the flow guiding mechanism is disposed at a position near the cooling medium inlet, and the other end connects to the separator plate at a position near the through opening, wherein the at least one spout is disposed on the separator plate, and wherein the flow guiding mechanism is configured to guide part of the cooling medium flowing into the first part from the cooling medium inlet into space between the flow guiding mechanism and the separator plate, so as to enable this part of the cooling medium to enter the second part through the at least one spout.

7. The board cooling apparatus according to claim 4, wherein the flow guiding mechanism comprises a flow leading part and a flow guiding part, wherein the flow leading part and the flow guiding part are disposed around the separator plate, wherein there is at least one opening on the flow guiding part, wherein the flow leading part is disposed on the side which is of the separator plate and is near the first part, and wherein the flow leading part is configured to guide part of the cooling medium flowing into the first part from the cooling medium inlet into space between the separator plate and the flow guiding part, wherein the flow guiding part is disposed on the side which is of the separator plate and is near the second part, and wherein the flow guiding part is configured to guide part of the cooling medium between the separator plate and the flow guiding part into the second part through the opening.

8. The board cooling apparatus according to claim 4, wherein a circulating pump is disposed at a position which is on the board, near the through opening, and between the flow guiding mechanism and the separator plate, so as to accelerate the guiding of part of the cooling medium into space between the separator plate and the flow guiding part.

9. The board cooling apparatus according to claim 1, wherein a high power consumption device comprised in the first part and the second part is disposed at a position which is on the board and is near the cooling medium inlet.

10. The board cooling apparatus according to claim 1, wherein a low power consumption device comprised in the first part and the second part is disposed at a position which is on the board and is near the cooling medium outlet.

11. An information equipment, comprising:
a shell;
a board, wherein the board and an interior wall of the shell form a closed space, wherein a cooling medium inlet and a cooling medium outlet are disposed on the shell, wherein a cooling medium flows through the cooling medium inlet and into the closed space formed by the board and the interior wall of the shell, wherein the cooling medium flows out through the cooling medium outlet after flowing over electronic devices on the board, and wherein the electronic devices on the board comprise multiple devices that are disposed on the board;
a separator plate, wherein the separator plate is disposed on the board in a direction perpendicular to the board, wherein the separator plate separates the board into a first part and a second part, wherein a through opening is located between the first part and the second part, wherein the cooling medium flows into the first part from the cooling medium inlet and flows into the second part through the through opening after flowing through a device of the first part, and wherein the cooling medium flows out the cooling medium outlet after flowing through a device of the second part; and
a flow guiding mechanism that is disposed on the board, wherein the flow guiding mechanism is configured to divert the cooling medium flowing into the first part from the cooling medium inlet, so as to guide part of the cooling medium into the second part directly.

* * * * *